(12) United States Patent
Wong

(10) Patent No.: US 6,713,311 B2
(45) Date of Patent: Mar. 30, 2004

(54) METHOD FOR SCREENING SEMICONDUCTOR DEVICES FOR CONTACT COPLANARITY

(75) Inventor: Lik Son Wong, Singapore (SG)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/962,407

(22) Filed: Sep. 25, 2001

(65) Prior Publication Data

US 2003/0059965 A1 Mar. 27, 2003

(51) Int. Cl.$^7$ .............................................. H01L 21/66
(52) U.S. Cl. ........................ 438/15; 438/14; 382/146; 356/602
(58) Field of Search ..................... 438/14, 15; 382/146; 356/602

(56) References Cited

U.S. PATENT DOCUMENTS 5,827,970 A * 10/1998 Poku et al. ................... 73/620

* cited by examiner

Primary Examiner—Amir Zarabian
Assistant Examiner—Christy Novacek
(74) Attorney, Agent, or Firm—Michael K. Skrehot; Wade James Brady, III; Frederick J. Telecky, Jr.

(57) ABSTRACT

A method for determining contact coplanarity of packaged semiconductor devices having a plurality of contacts. The method includes the steps of measuring the relative positions of the contacts on a subject semiconductor device; calculating from the measurements seating planes 64 formed by tilting the device to one or more of its corners and/or sides such that each said plane comprises contacts at or adjacent to the corners of the device; using the measured relative contact positions and the calculated seating planes to determine the highest deviation from contact coplanarity for the semiconductor device.

9 Claims, 17 Drawing Sheets

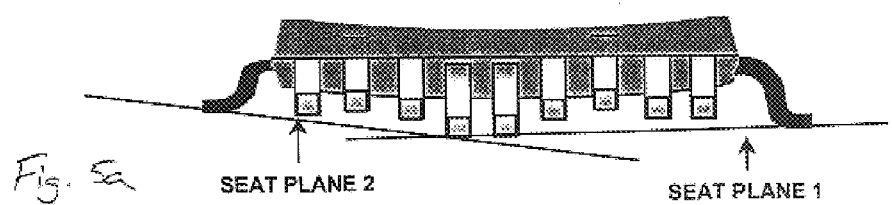
Fig. 5a  SEAT PLANE 2   SEAT PLANE 1
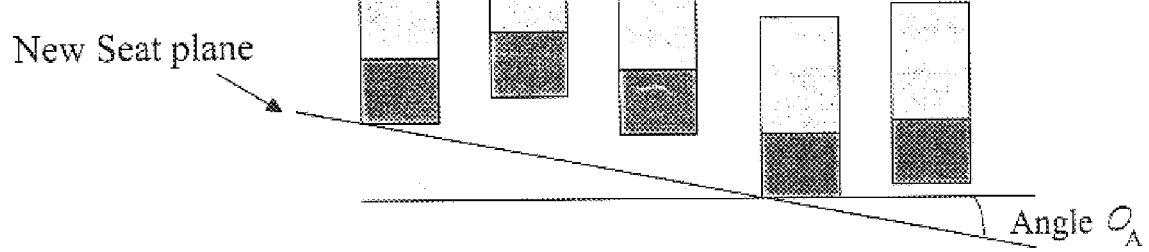
New Seat plane   Angle $O_A$
Fig. 5b

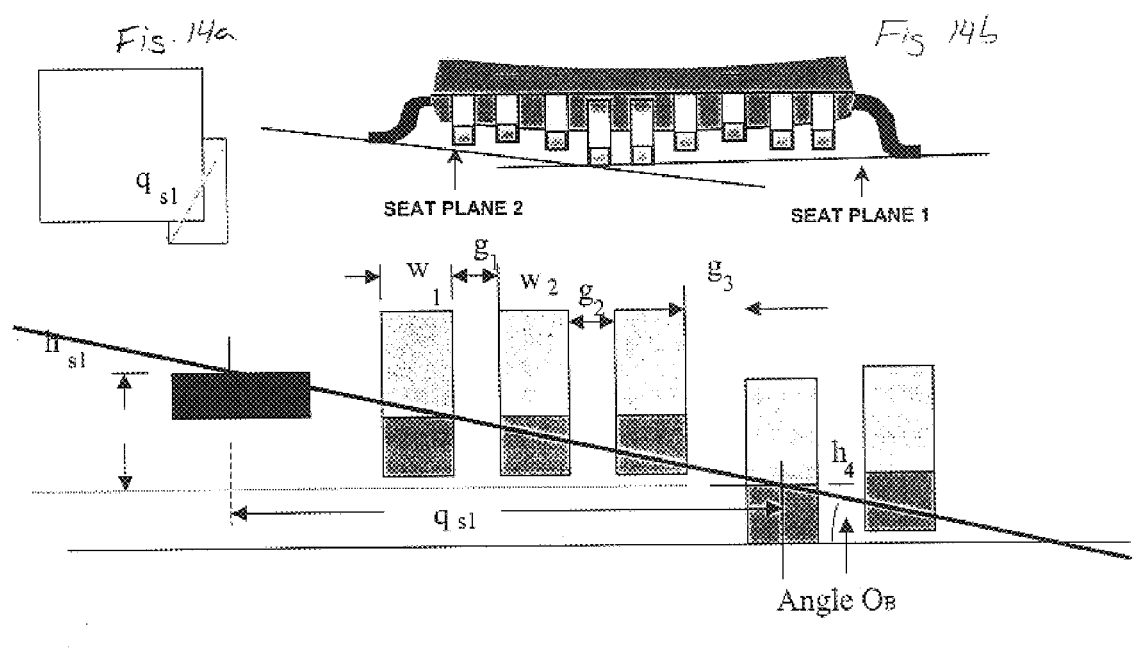

Spec of 0 to 7 deg for lead forming angle

METHOD FOR SCREENING SEMICONDUCTOR DEVICES FOR CONTACT COPLANARITY

CROSS-REFERENCE TO RELATED APPLICATIONS

Not applicable.

BACKGROUND OF THE INVENTION

This invention is in the field of semiconductor assembly, testing, and packaging.

An integrated circuit in its unpackaged state is susceptible to damage and its small size and dense features cause difficulties when interconnecting the integrated circuit with other electronic components in a system. Consequently, an integrated circuit is typically packaged in plastic or ceramic and the interconnection problems are solved by leads extending from the plastic or ceramic package material, or in the case of a Ball Grid Array (BGA) package, by solder balls attached to contact pads on the bottom side of the device package. FIG. 1 is a side cross-sectional view of a leaded, packaged integrated circuit, hereinafter referred to as a "semiconductor device". The integrated circuit 10 is mounted on a leadframe 12. Electrical connection between the integrated circuit 10 and the leads 14 is established by bond wires 16. The integrated circuit 10, the leadframe 12, the bond wires 16, and a portion of leads 14 are encapsulated in packaging material 18, which is typically plastic or ceramic. Leads 14 are bent into a gullwing shape that is suitable for surface mounting. Well-known package types such as the Thin Small Outline Package (TSOP) and the Quad Flat Package (QFP) typically have the features shown in FIG. 1. FIG. 2a is a top view of a square QFP semiconductor device showing plastic encapsulant 20 with leads 22 along all four sides of the device. FIG. 2b is a side view of the QFP semiconductor device illustrating the shape of the leads.

In practice, the semiconductor device is mounted on a printed circuit board (PCB) with electrical connection between the leads and the pads on the PCB established with solder. Coplanarity of the leads is important in order to ensure that all leads properly contact the appropriate pads on the PCB. However, leads are easily bent, in particular in testing and burning-in of the device, in packing and shipping of the device, as well as in the assembly process in which the device is mounted on a PCB. Consequently, a need has been recognized by the electronics industry to establish standards for lead coplanarity. An example is JEDEC Standard JESD22-B108 "Coplanarity Test for Surface-Mount Semiconductor Devices." Equipment manufacturers have responded by developing optical/laser systems for measuring deviations of leads from coplanarity. Coplanarity inspection typically consists of laser triangulation to map the coordinates of the leads of the package, or in the case of BGA, the solder balls, relative to the other leads or balls. Once the coordinates have been measured, a seating plane including the lowest three leads or solder balls is calculated. Automated software then determines whether the remaining leads or balls are within a specified distance above the seating plane. Unfortunately, these prior art techniques suffer from shortcomings that can result in an unacceptable failure rate when the semiconductor device is mounted on a PCB. This is particularly true when the seating plane is determined by three leads or balls in close proximity to one another, or when the package is warped.

The JEDEC test JESD22-B108 consists of measuring the distance between the intended contact point of a lead and a seating plane. The seating plane is defined as the plane established by the contact points of three or more leads that support the device when it is placed on top of a planar surface. FIGS. 3a and 3b show an example of a seating plane 32 calculated using the JEDEC test. The lowest three leads 34 are the corners of the triangle and the maximum lead distance above the seating plane is the lead coplanarity 36 for the particular device shown. The center of gravity 30 of the device is indicated in FIG. 3a. Equipment vendors have developed systems that establish the seating plane and measure the deviation of the leads from coplanarity as required by the standard. However, in an unacceptable number of cases, devices that pass this test later fail coplanarity tests when mounted on a PCB. The JEDEC test assumes the device is mounted on a planar surface. A PCB is often far from ideally planar. In addition, some measurement equipment measures coplanarity deviation from the top side of the lead, a technique which assumes that all leads are of the same thickness. A variation in thickness of the leads can change the seating plane measured in the JEDEC test. Some equipment measures coplanarity while the devices are packed in trays, creating potential for miscomputation of the seating planes. For larger packages in particular, there is potential for tilting and a change of seating plane, not only from lead thickness variations, but also from downward force applied during component placement and during wave-soldering when solder paste under the leads typically loses significant volume, for example. Variations in solder paste applied to the PCB solder pads on which the leads sit could also be a problem. Of course, any device warpage or variations in the lead forming angle will exacerbate the deviations from lead coplanarity. Similar problems apply to BGA packages.

In response to the shortcomings of the single seating plane method described above, the test and measurement industry has developed a dual seating plane method for predicting coplanarity problems. The single seating plane method is particularly inadequate in situations where the center of gravity of the device is contained within a narrow seating plane triangle, or when a side of a narrow seating plane triangle passes through the center of gravity. Such a situation is shown in FIGS. 4a and 4b. In FIG. 4a, the seating plane 42 has an edge passing through the center of gravity 40. In addition, the seating plane triangle 42 is relatively narrow, which results in a tendency of the device to tilt. The prior art dual seating plane method therefore assumes that the device will tilt and calculates a new seating plane 44 based on the predicted tilt. The lead coplanarity 46 is determined relative to this tilted plane 44. One disadvantage of this approach is that it depends upon a determination of whether the seating plane is narrow or not. If a narrow plane is mistakenly detected as non-narrow, significant errors in determining lead coplanarity will result. Furthermore, in selecting the new seating plane 44, the prior art dual seating plane method does not systematically choose the corner pins as one or more of its seating points. Rather, it selects a lead based on a pre-determined formula, such as the lowest lead twenty leads away from the previous lead on either side of the center of gravity of the device, and then calculates the worst-case coplanarity deviation for the original as well as these additional seating planes. This creates a situation in which the device could again tilt from the selected seating plane; if, for instance, the new planes are narrow or if the new seating planes are not near the corners. In summary, this dual plane method is an improvement over the single plane method, but still is inadequate in predicting worst case coplanarity, particularly in situations where warpage of the semiconductor device is present. The inadequacies of the prior art methods lead to screening errors that can result in either a lower device yield than is necessary, or in a customer receiving out-of-specification devices, neither of which is acceptable.

BRIEF SUMMARY OF THE INVENTION

In an embodiment of the invention, a method for determining contact coplanarity of packaged semiconductor devices having a plurality of contacts is disclosed. The method includes the steps of measuring the relative positions of the contacts on a subject semiconductor device; calculating from the measurements seating planes formed by tilting the device to one or more of its corners and/or sides such that each said plane comprises contacts at or adjacent to the corners of the device; using the measured relative contact positions and the calculated seating planes to determine the highest deviation from contact coplanarity for the semiconductor device.

In another embodiment of the invention, a method for screening for contact coplanarity packaged semiconductor devices having a plurality of contacts is disclosed. The method includes the steps of measuring the relative positions of the contacts on a subject semiconductor device; calculating from the measurements seating planes formed by tilting the device to one or more of its corners and/or sides such that each said plane comprises contacts at or adjacent to the corners of the device; using the measured relative contact positions and the calculated seating planes to determine the highest deviation from contact coplanarity for the semiconductor device; and comparing the highest deviation from contact coplanarity to a pre-determined specification.

In still another embodiment of the invention, a semiconductor test apparatus is disclosed. The apparatus includes a tool operable to measure the relative positions of contacts on a packaged semiconductor device and a computer operable to use the relative positions to determine seating planes formed by tilting the device to one or more of its corners and/or sides such that each said plane comprises contacts at or adjacent to the corners of the device. The computer is further operable to calculate a highest deviation from contact coplanarity using the measured relative contact positions and the seating planes.

An advantage of the invention is that it enables efficient screening of semiconductor devices for worst-case deviations from lead coplanarity. The inventive methods and apparatus were developed in view of the fact that semiconductor devices are typically placed on a PCB having a rough and uneven surface.

BRIEF DESCRIPTION OF THE SEVERAL VIEWS OF THE DRAWINGS

FIGS. 5a and 5b are top and side views, respectively, of a device showing the role of corner leads in restraining the tilt of a device;

FIGS. 14a, 14b, and 14c are top, side, and magnified views, respectively, of a device in which the corner seating point is a corner lead, or a lead adjacent to the corner lead, on a device side adjacent to the side being viewed, where lead position is measured from the top side of the lead;

DETAILED DESCRIPTION OF THE INVENTION

A device with any seating plane, narrow or otherwise, can be expected to tilt when it is placed on an uneven surface, and a typical PCB has an uneven surface. A semiconductor device placed on a PCB will often rock to one side or another, or rock along a diagonal axis of the device, or a combination of both. Applicant has determined that the amount of tilt or rocking is dependent upon the position of the corner leads of the device. It is typically true that the worst-case or highest deviation from coplanarity of the leads of a device will occur at the far corner when the device seats at one of its corner pins (or balls in the case of BGA), or on a few pins near the corner. The corner pins tend to restrain the device from further tilting even when the leads away from the corners have a higher coplanarity deviation than the corner pins. FIGS. 5a and 5b are illustrations of the role of the corner pins in restraining tilt. Note that the relative position of the leads can be determined by well known techniques such as laser triangulation and with tools such as an optical comparator.

Figure 1:
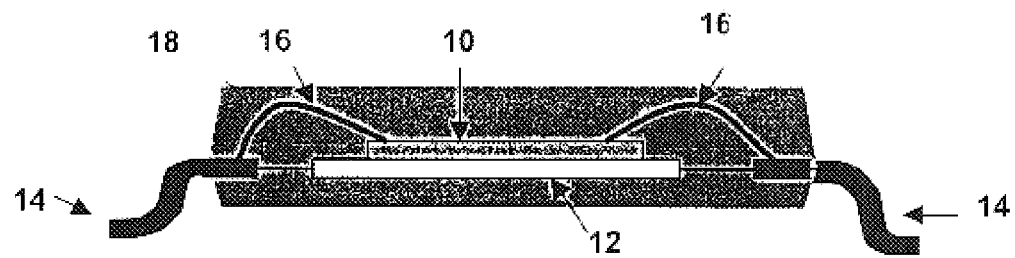
FIG. 1 is a cross-section side view of a prior art leaded, packaged integrated circuit.
Figure 2A:
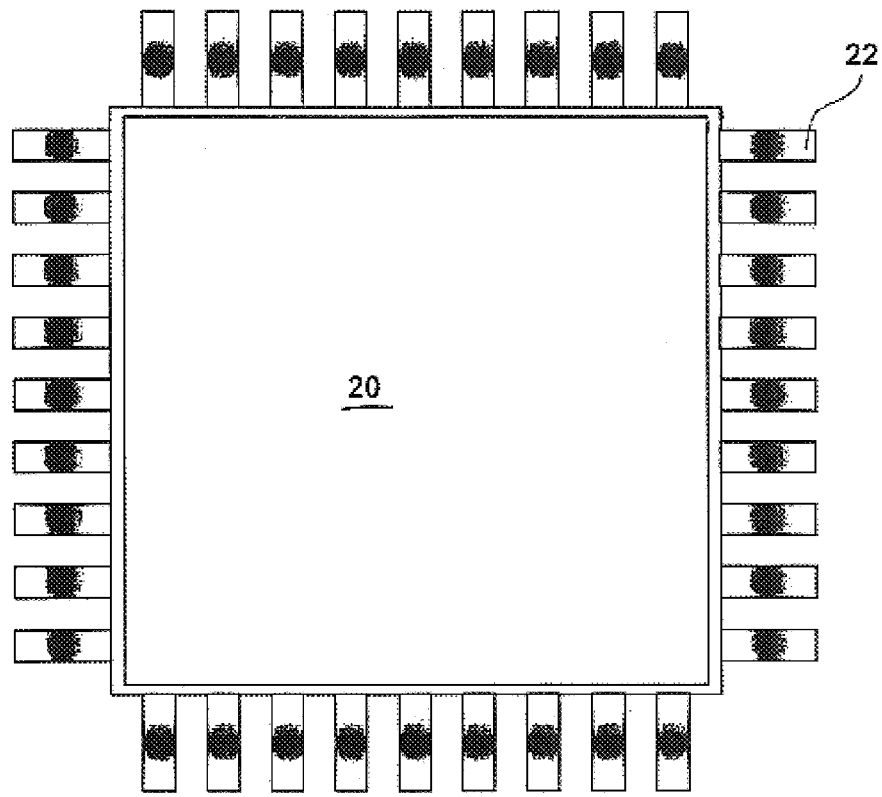
FIGS. 2a and 2b are top and side views, respectively, of a prior art QFP device.
Figure 2B:
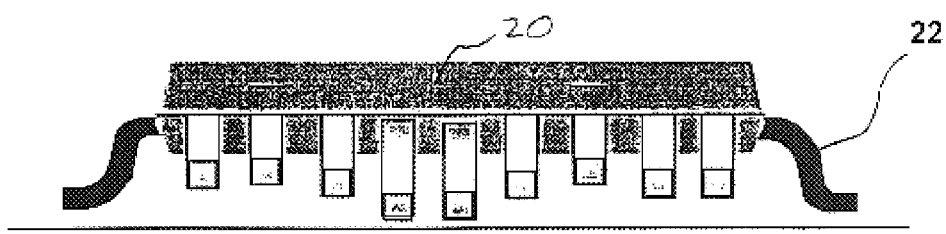
Figure 3:
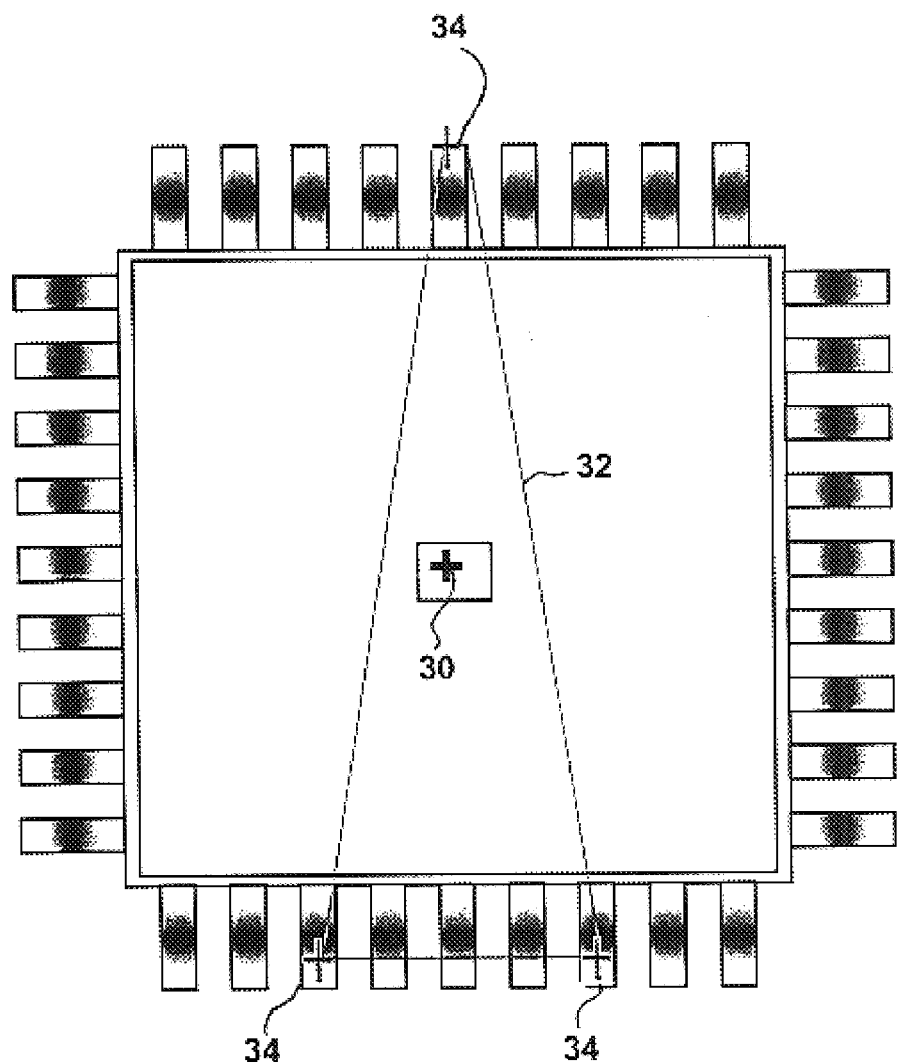
FIGS. 3a and 3b are top and side views, respectively, of a device showing an implementation of a prior art three-point seating plane method.
Figure 3:
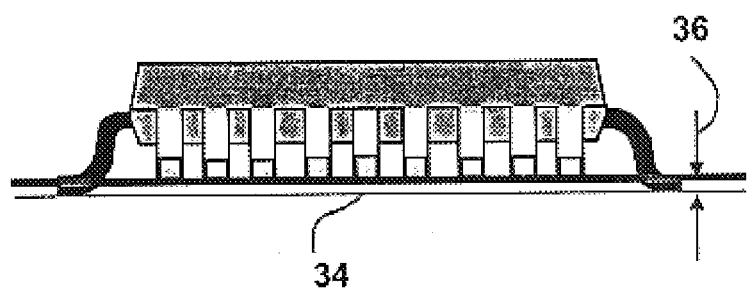
Figure 4:
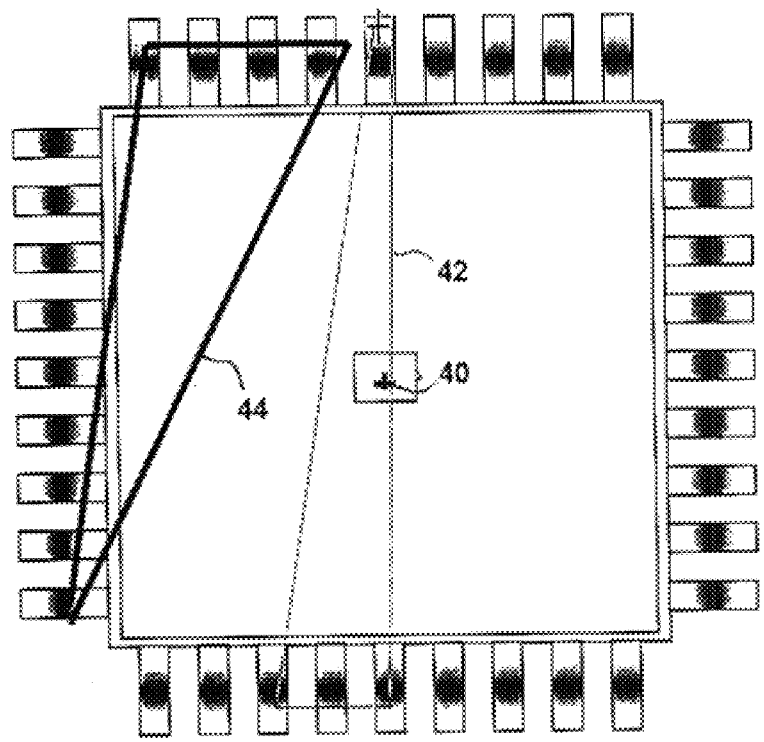
FIGS. 4a and 4b are top and side views, respectively, of a device showing the effects of a narrow seating plane angle and the implementation of a prior art dual seating plane method.
Figure 4B:
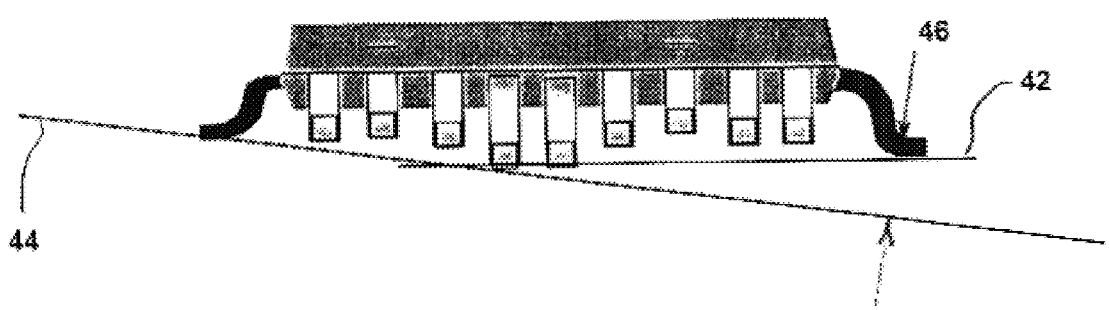
Figure 6A:
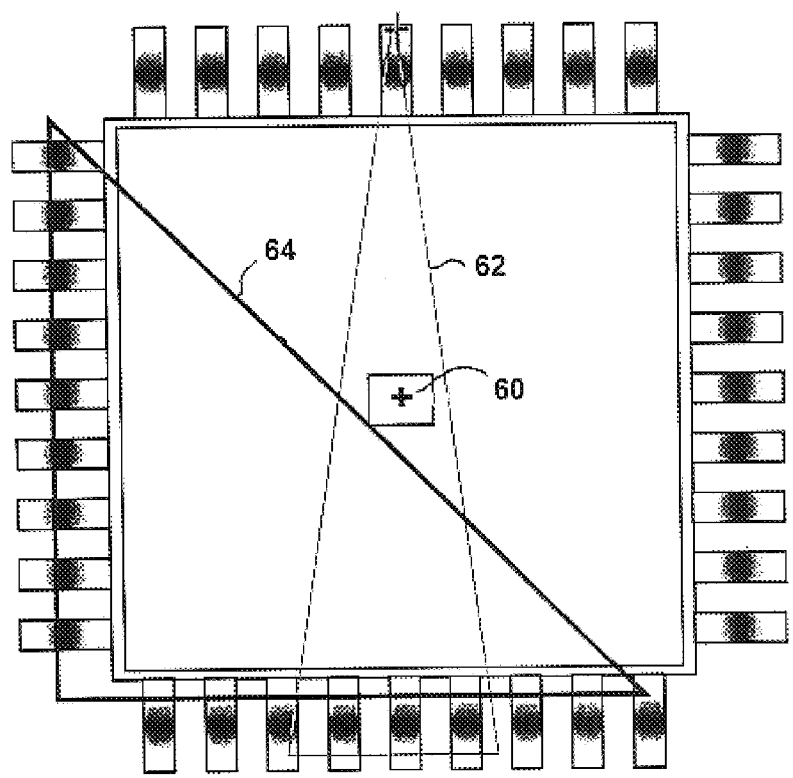
FIGS. 6a and 6b are top and side views, respectively, of a device showing an application of an embodiment of the inventive method.
Figure 6B:
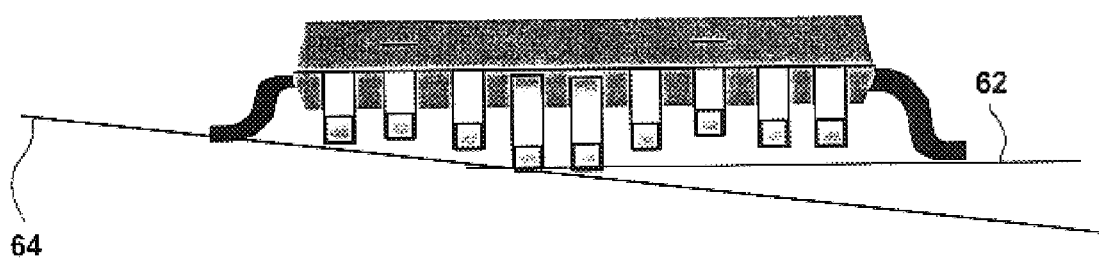
Figure 7A:
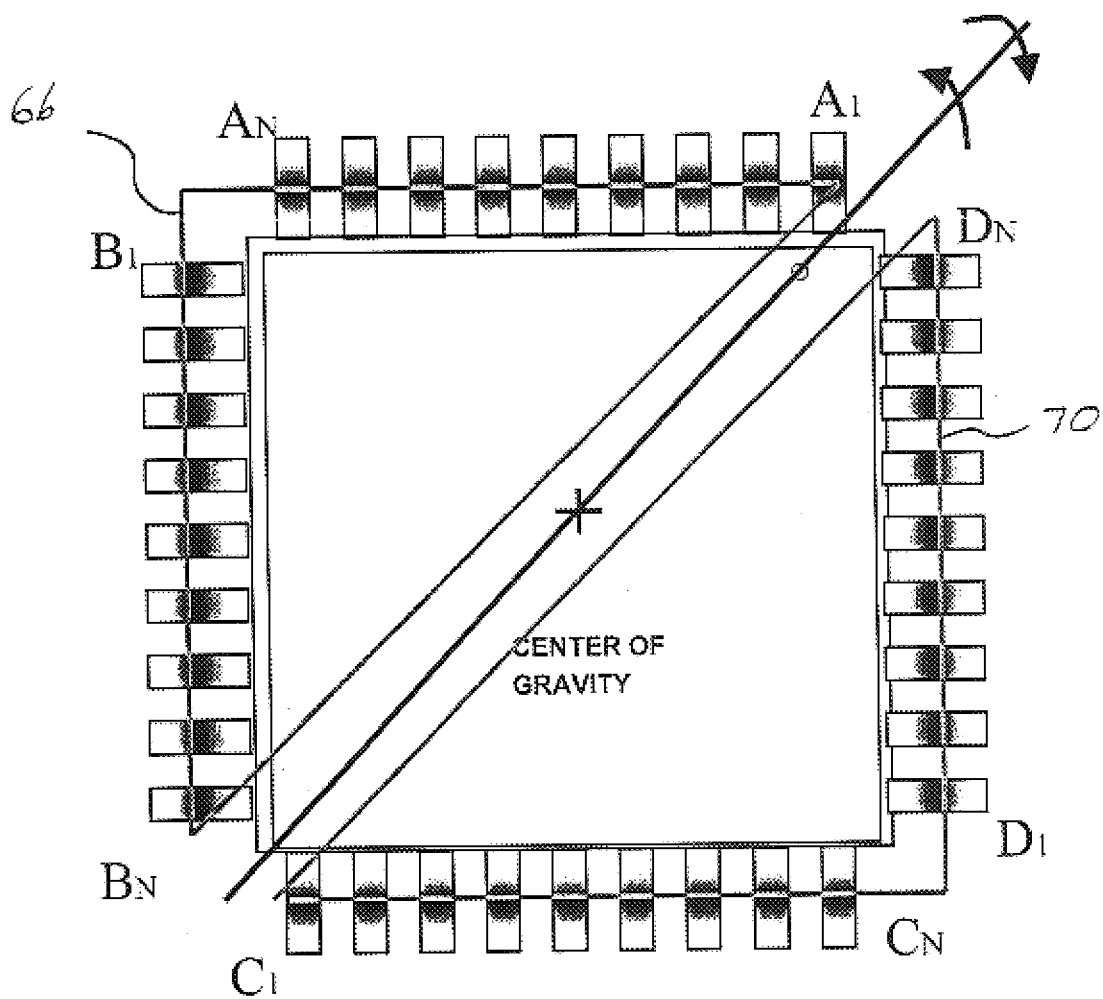
FIGS. 7a and 7b show four seating planes that would exist if the device were tilted to its four corners.
Figure 7B:
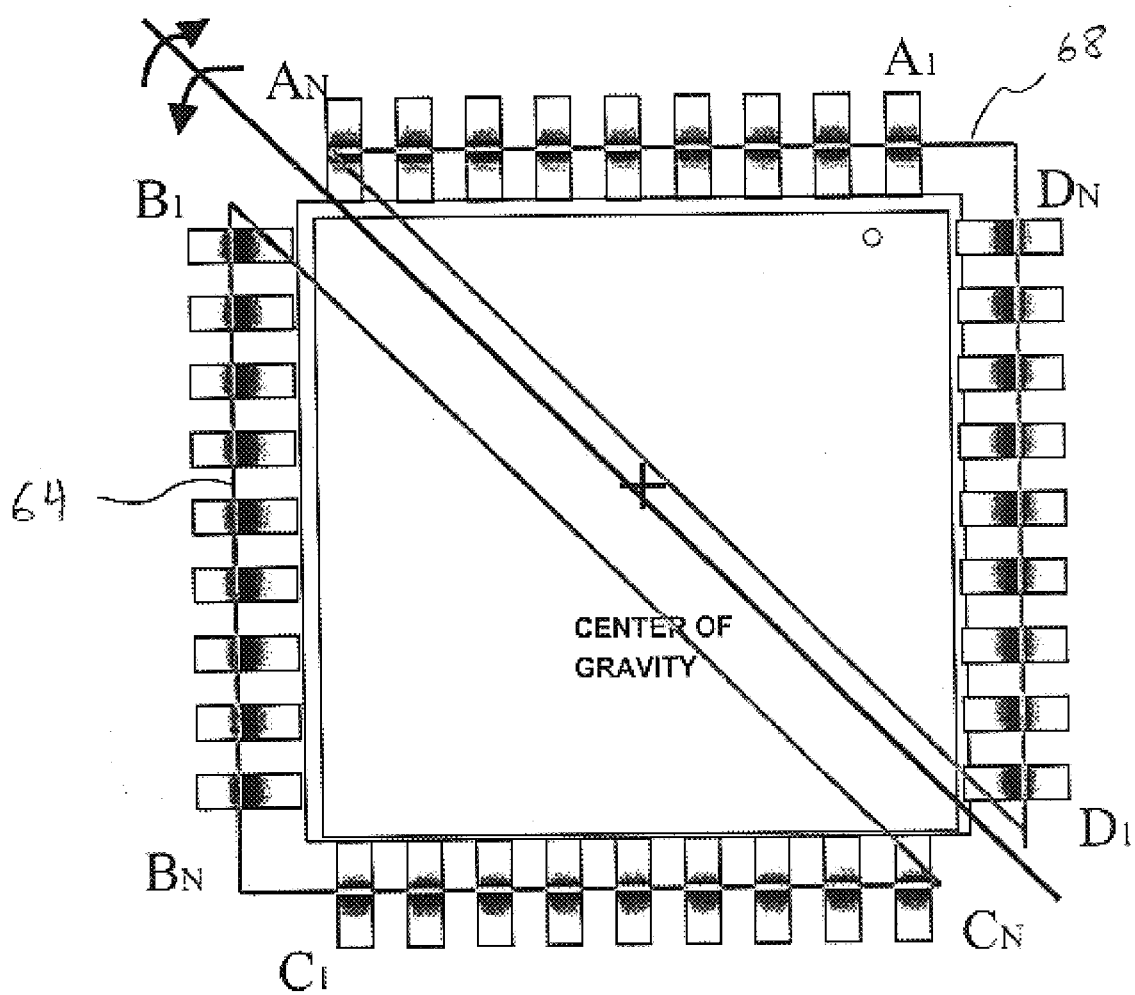
Figure 7C:
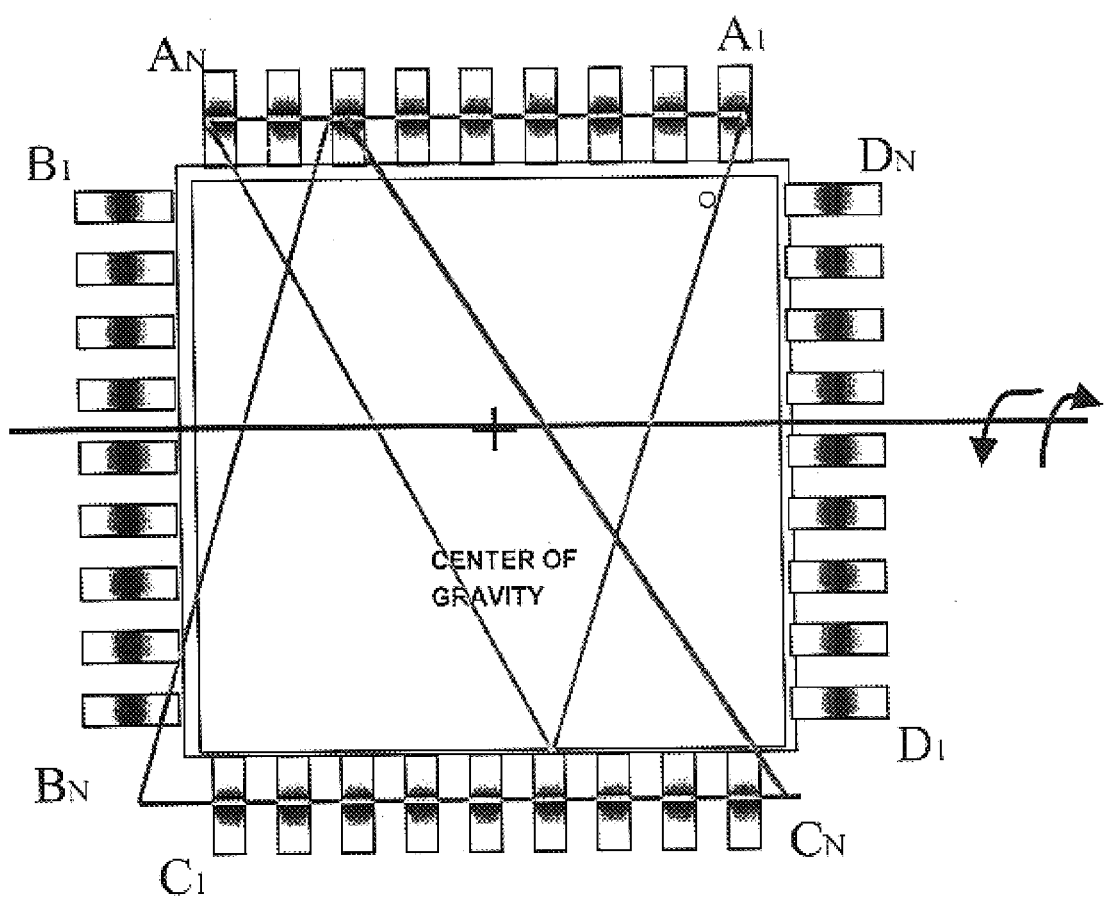
FIGS. 7c and 7d show seating planes that would exist if the device were tilted to its four sides.
Figure 7D:
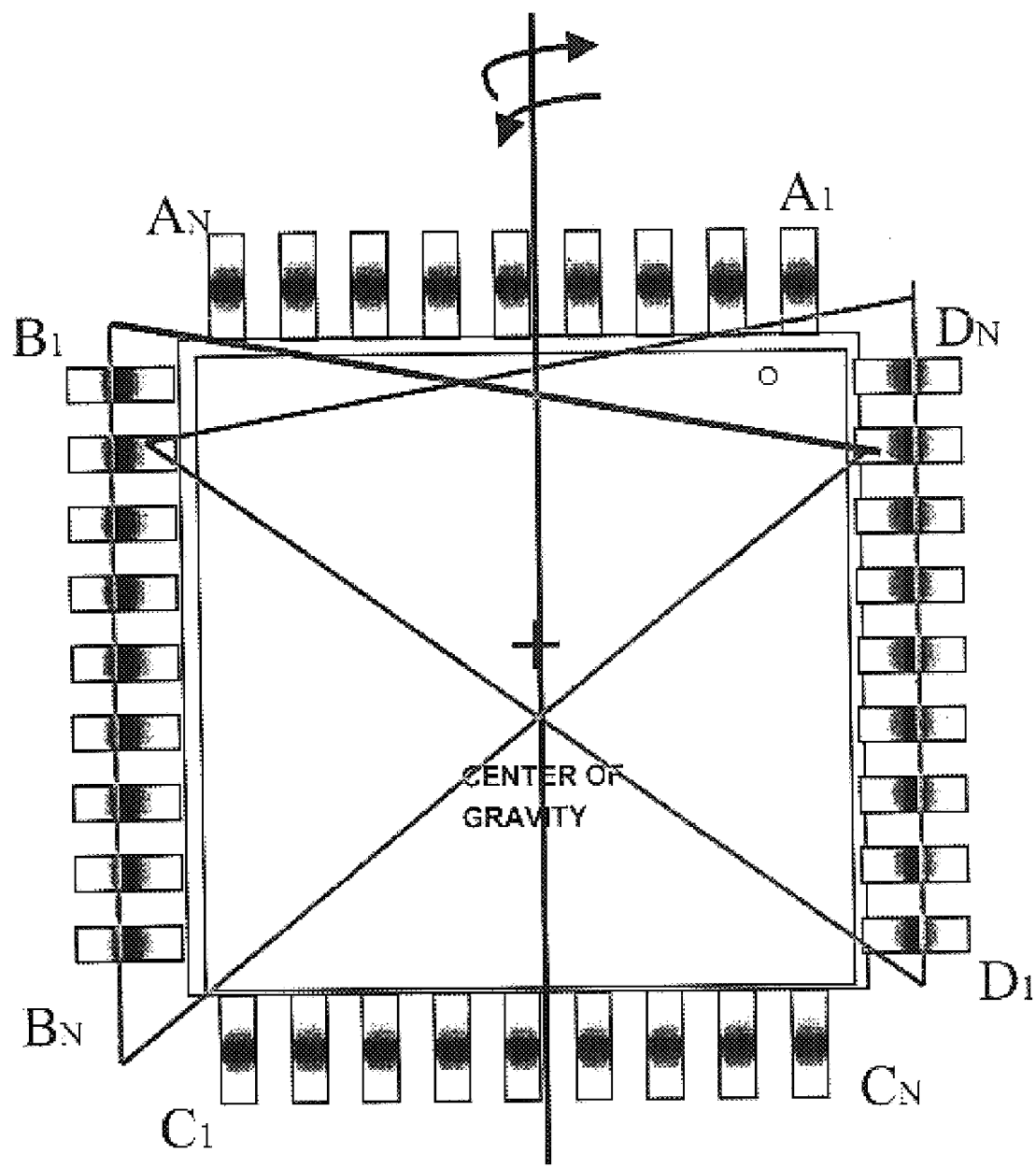

A preferred embodiment of the inventive method is described with reference to FIGS. 6a and 6b. FIG. 6a shows a package with an original seating plane 62 that does not have an edge intersecting the center of gravity 60 of the device. Hence, the prior art techniques would rely on the single plane technique since it is assumed that a seating plane that does not pass through the center of gravity is not prone to tilting or rocking. The inventive approach, however, assumes that any device will tilt to rest on a corner when placed on an uneven surface such as a PCB. In this case, a device tilting to rest on the lower left corner of the device will result in a new seating plane 64. The seating plane is determined using coplanarity data taken using a test such as the prior art JEDEC three-point method, for example, rather than physically tilting the device for measurement. The coplanarity of the device is calculated based on this new seating plane. These steps are then repeated for each corner of the device. FIGS. 7a and 7b show the four seating planes assuming the device is tilted in turn to all four corners. Seating plane 64 is the seating plane shown in FIG. 6a that is formed by rocking the device to its lower left corner. Seating plane 66 is the seating plane that is formed by rocking the device to its upper left corner. Seating plane 68 is the seating plane that is formed by rocking the device to its upper right corner. Seating plane 70 is the seating plane that is formed by rocking the device to its lower right corner. As mentioned above, devices can tilt to one side when placed on a PCB rather than to a corner. FIGS. 7c and 7d show the four seating planes assuming the device is tilted sideward. Two of the points of the seating planes would be on one side while the third could be in any position along any of the other three sides.

The coplanarity is calculated for each of the four corner-based seating planes and/or for each of the four side-based seating planes, or for a subset of these seating planes. The worst case coplanarity result of all the seating planes considered is then used to determine whether the lead coplanarity meets the specifications set by the manufacturer or by its customers. The inventive method for determining worst-case or highest deviation from lead coplanarity based on the corner leads has been shown to be superior to both the prior art single- and dual-plane approaches. It lessens the chance that good devices will be screened out, and also reduces the chances that a customer will receive devices that do not meet its specifications.

Since the goal of the measurement is the worst-case or the highest deviation from lead coplanarity, in an alternative embodiment the lead with the highest coplanarity is identified and then the corner closest to opposing the lead with highest coplanarity is tested as part of the seating plane and vice versa. The next highest coplanarity lead could then be tested using the corner closest to opposing it, and so on.

Figure 8A:
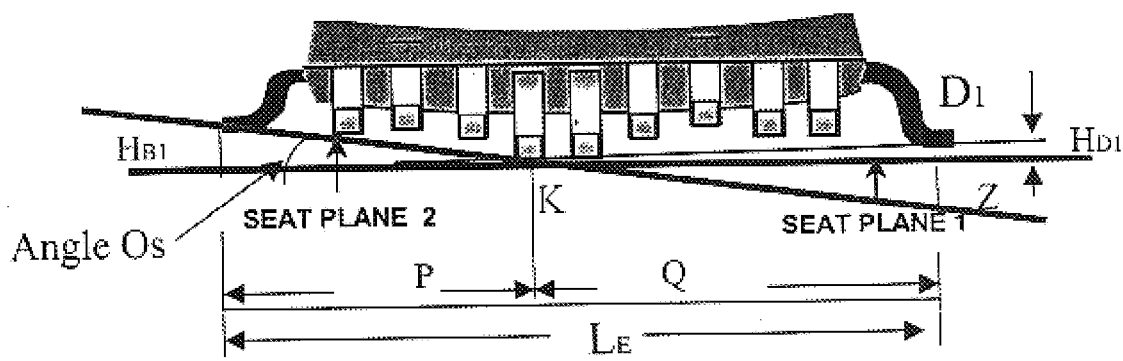
FIGS. 8a and 8b are side and top views, respectively, of a device showing an application of an embodiment of the inventive method.
Figure 8B:
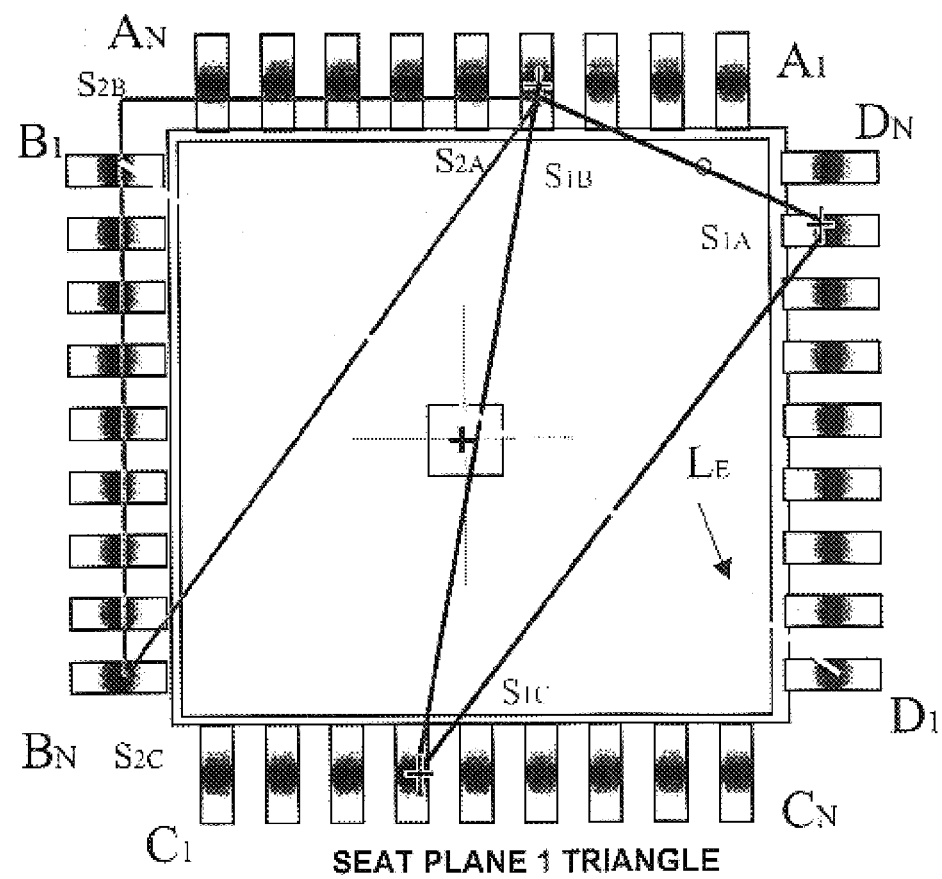

The worst case coplanarity deviation of a device can be computed from the coplanarity measurement and other position measurements obtained from either the single- or dual-plane method. As is illustrated in FIGS. 8a and 8b, the device having an original seating plane formed by points $S_{1A}$, $S_{1B}$, and $S_{1C}$ is assumed to have a new seating plane formed by points $S_{2A}$, $S_{2B}$, and $S_{2C}$ after it is tilted toward the corner lead at $B_1$. The coplanarity deviation of the lead at the far corners, $A_1$, $C_N$, $D_1$, and $D_N$ are re-computed. This new coplanarity at $D_1$ is equal to:

$H_{D1}+Z$; and $H_{D1}+Q$ Tangent $O_S$, where Tangent $O_S=Z/Q$; and $H_{D1}+QH_{B1}/P$, where Tangent $O_S=H_{B1}/P$; and $H_{D1}+H_{B1}(L_E-P)/P$, where $L_E=P+Q$; and $H_{D1}+H_{B1}(L_E/P-1)$.

Intercept point K, and hence lengths P and Q, can be obtained by solving a pair of linear equations. Namely, the equation for the line from $S_{2C}$ to $S_{2A}$, an edge of the new seating plane, can be described as $Y=M_1X+C_1$, where $M_1$ is the gradient and $C_1$ is the intercept of the Y axis.

The second equation is the line from $B_1$ to $D_1$, which is the line for computing the coplanarity at $D_1$ with reference to $B_1$, is described as $Y=M_2X+C_2$, where $M_2$ is the gradient and $C_2$ is the intercept of the Y axis.

These quantities are computed for at least a few adjacent leads at the highest far corner to determine whether their coplanarity deviation is higher than the corner lead. It is preferable to select one of the corner leads as a corner of the tilted seating plane triangle. For example, in FIG. 7a, for seating plane triangle 66, one would choose $A_N$ or $B_1$, depending on which is lower, because that corner of the triangle will be the point at which the rocking or tilting of the device is most likely to be restrained. Note that the shape of the seating plane triangle will be slightly different if $B_1$ is chosen as the corner of the triangle than if $A_N$ is chosen.

Figures 9A, 9B:
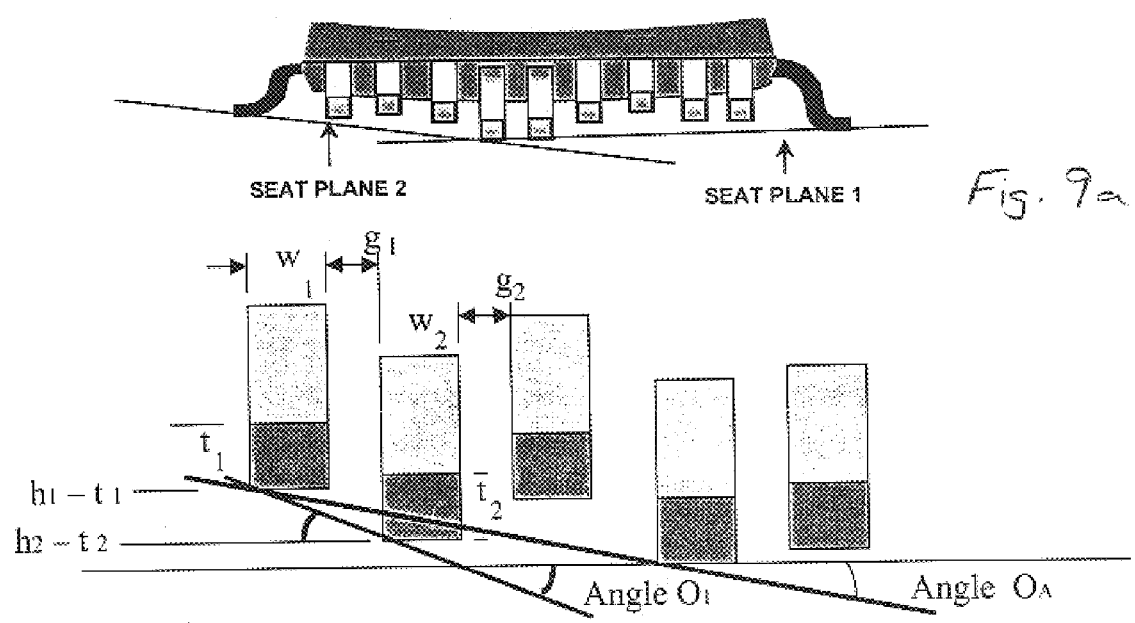
FIGS. 9a and 9b are side and magnified views, respectively, of a device indicating the effects of a corner lead being higher than an adjacent lead.

The preceding discussion assumed that the corner lead was lower than adjacent leads. In the case where a lead adjacent to the corner lead is lower than the corner lead, the test tool would select the adjacent lead as one of the points of the new seating plane when the device is tilted. As is illustrated in FIGS. 9a and 9b, this condition occurs where the angle $O_1$ between the corner lead and the adjacent lead is greater than angle $O_A$ between the original seating plane and a plane based only on the corner lead. Referring to FIG. 9b, where $O_1>O_A$, Tangent $O_1=(h_1-t_1)-(h_2-t_2)/(w_1+g_1)$.

Figures 10A, 10B:
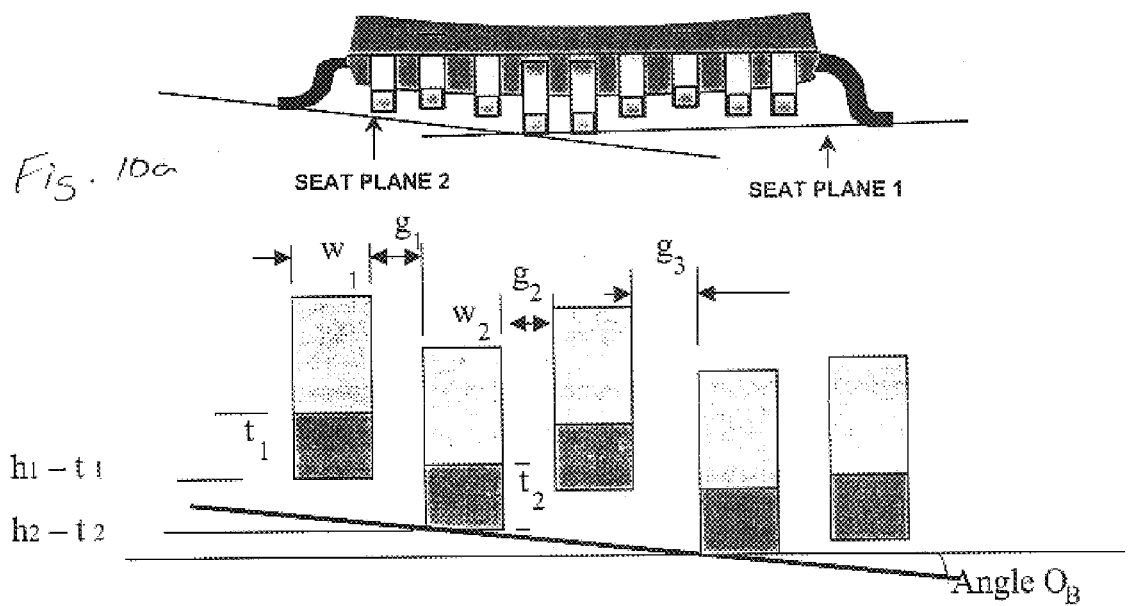
FIGS. 10a and 10b are side and magnified views, respectively, of a device indicating the effects of a corner lead being higher than an adjacent lead.

Referring now to FIGS. 10a and 10b, the angle $O_B$ of the new seating plane with respect to the original seating plane can be found as follows, Tangent $O_B=(h_2-t_2)/[(w_2+g_2)+(w_3+g_3)]$.

Figures 11A, 11B:
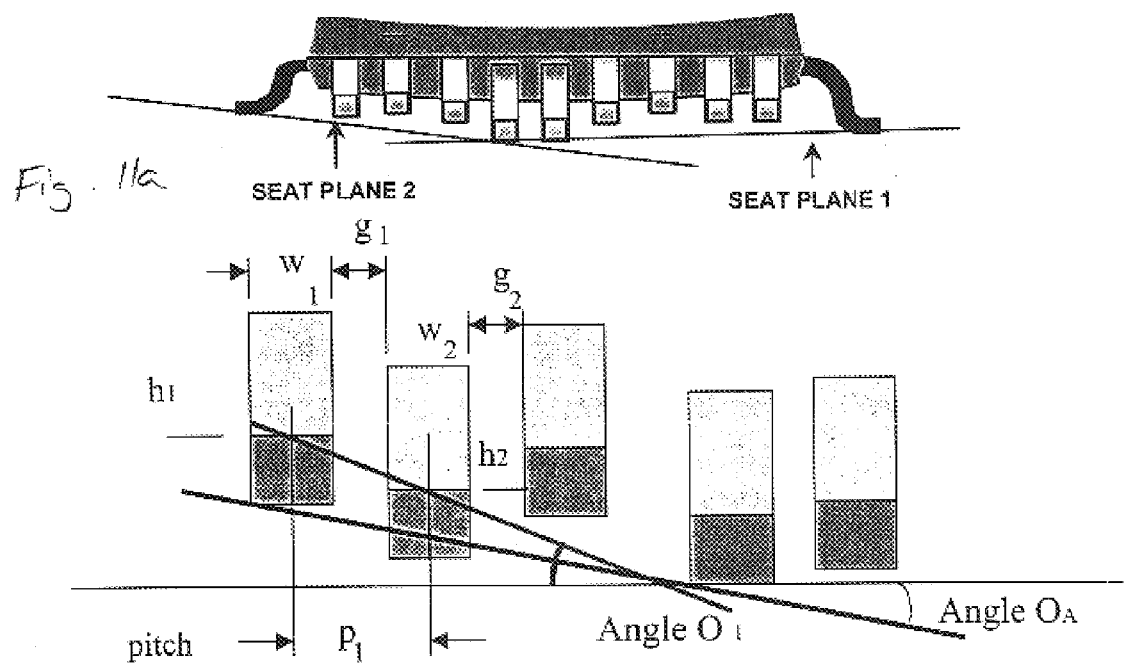
FIGS. 11a and 11b are side and magnified views, respectively, of a device indicating the effects of a corner lead being higher than an adjacent lead, where lead position is measured from the top side of the lead.

In the event a tool is used that determines lead position from the top side and therefore does not comprehend the thickness of the leads, an alternative method for determining angle $O_1$ can be employed. Referring to FIGS. 11a and 11b, where again, $O_1>O_A$, Tangent $O_1=(h_1-h_2)/p_1$.

Figures 12A, 12B:
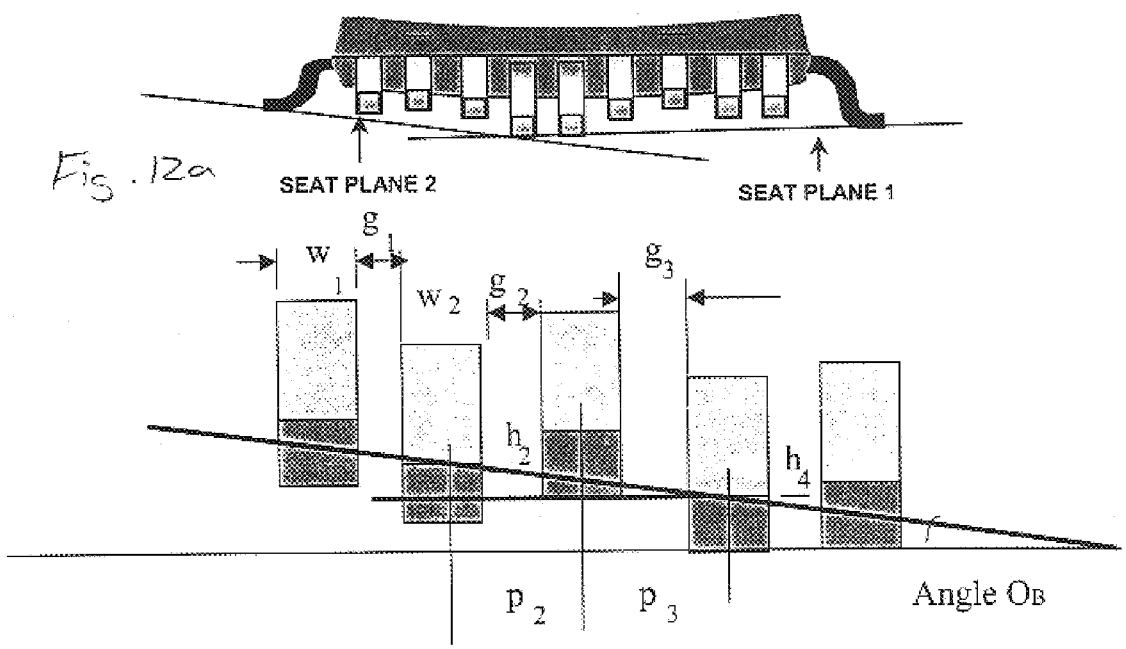
FIGS. 12a and 12b are side and magnified views, respectively, of a device indicating the effects of a corner lead being higher than an adjacent lead, where lead position is measured from the top side of the lead.

Referring now to FIGS. 12a and 12b, the angle $O_B$ of the new seating plane with respect to the original seating plane can be found as follows, Tangent $O_B=(h_2-h_4)/(p_2+p_3)$.

Figures 13A, 13B:
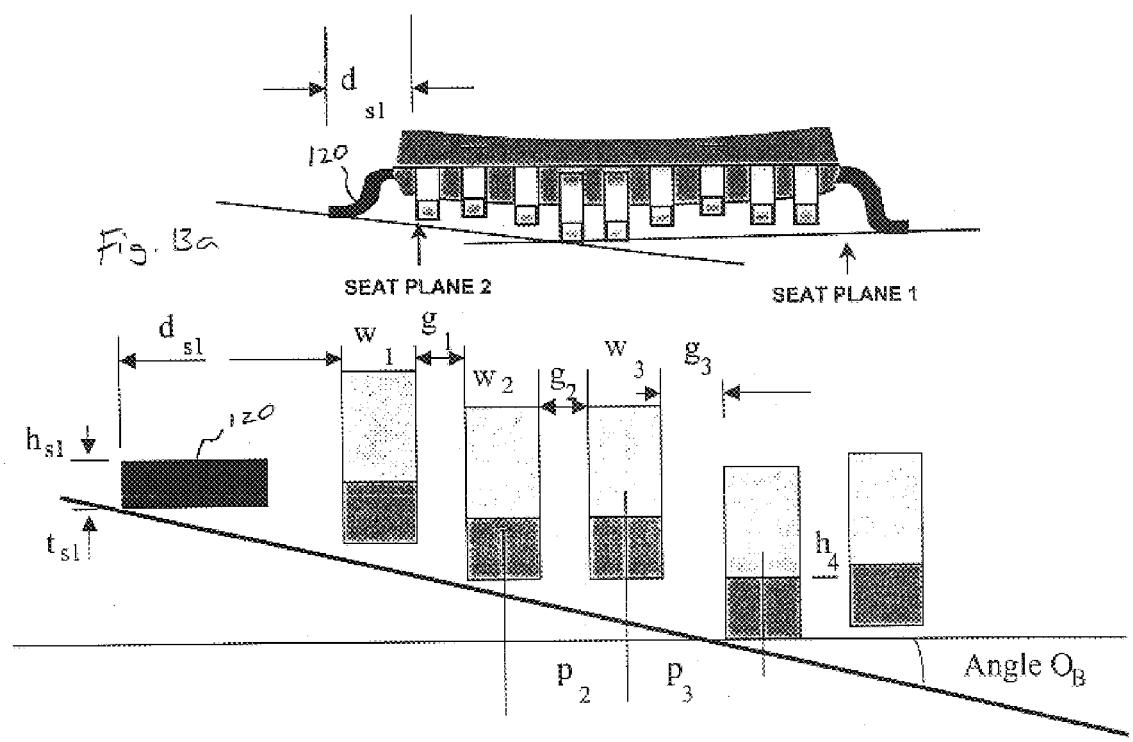
FIGS. 13a and 13b are side and magnified views, respectively, of a device in which the corner seating point is a corner lead, or a lead adjacent to the corner lead, on a device side adjacent to the side being viewed.

Another possible situation is shown in FIGS. 13a and 13b, where the corner seating point is the corner lead 120, or a lead adjacent to the corner lead, on a side adjacent to the side of the device being viewed in FIG. 13a. In this case, the angle of the new seating plane with respect to the original seating plane can be determined as follows, Tangent $O_B=(h_{s1}-t_{s1})/[(d_{s1}+(w_1+g_1)+(w_2+g_2)+(w_3+g_3)]$.

For tools that measure lead position from the top side, the angle of the new seating plane with respect to the original seating plane can be determined using the parameters shown in FIGS. 14a, 14b, and 14c as follows, Tangent $O_B=h_{s1}/q_{s1}$.

Figure 15A:
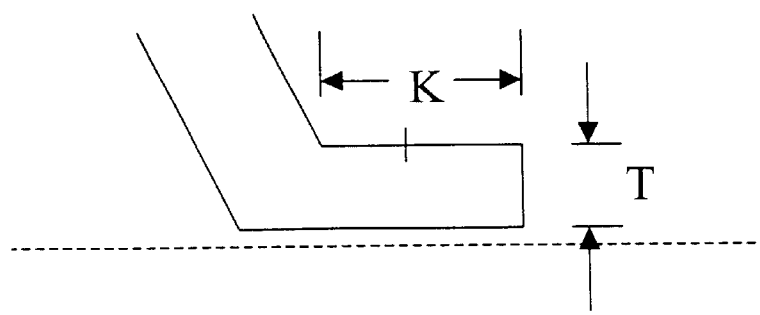
FIGS. 15a and 15b show leads with ideal and non-ideal lead forming angles, respectively.
Figure 15B:
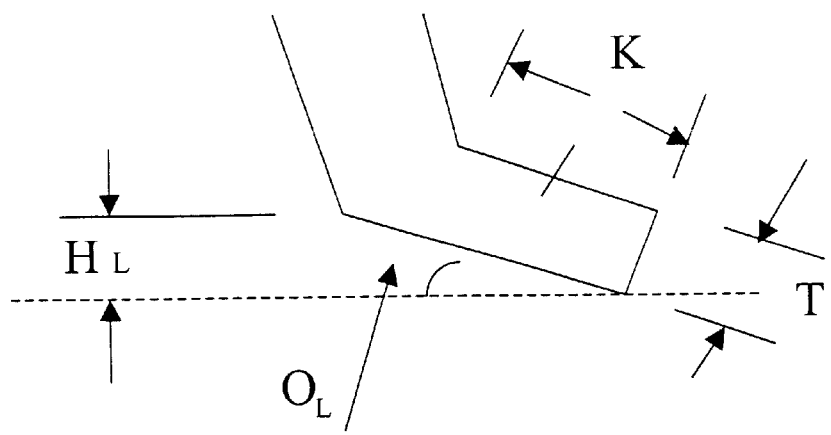

As mentioned above, the lead coplanarity is also affected by the lead forming angle. Some laser inspection systems measure the forming angles of each lead, which allows for a calculation of the effect of the lead forming angle on lead coplanarity. FIG. 15a shows a lead with an ideal, flat forming angle, whereas the lead shown in FIG. 15b is non-ideal. An estimation of the increase in coplanarity of a lead because of the non-ideal forming angle can be obtained as follows, Sine $O_L=H/K$, so $H=K$ Sine $O_L$.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. For example, the embodiments described and shown herein are leaded, packaged devices. One skilled in the art will appreciate that the scope of the concepts presented herein would be equally applicable to packaged devices with contacts in a form other than leads, e.g. solder balls on the underside of a BGA package. It is contemplated that such modifications and alternatives are within the scope of this invention as subsequently claimed herein.

I claim:

1. A method for determining contact coplanarity of packaged semiconductor devices having a plurality of contacts, comprising the steps of:
   measuring the relative positions of said contacts on a subject semiconductor device;
   calculating from said measurements seating planes that would be formed if said device were tilted to one or more of its corners and/or sides such that each said plane comprises contacts at or adjacent to the corners of said device;
   using said measured relative contact positions and said calculated seating planes to determine the highest deviation from contact coplanarity for said semiconductor device.

2. The method of claim 1, wherein said step of measuring comprises measuring the relative positions of said contacts using a 3-point seating plane method.

3. The method of claim 1, wherein said contacts are leads extending in a gull-wing pattern from said packaged semiconductor device.

4. The method of claim 1, wherein said contacts are solder balls attached to a bottom side of said packaged semiconductor device.

5. A method for screening for contact coplanarity packaged semiconductor devices having a plurality of contacts, comprising the steps of:
   measuring the relative positions of said contacts on a subject semiconductor device;
   calculating from said measurements seating planes that would be formed if said device were tilted to one or more of its corners and/or sides such that each said plane comprises contacts at or adjacent to the corners of said device;
   using said measured relative contact positions and said calculated seating planes to determine the highest deviation from contact coplanarity for said semiconductor device; and
   comparing said highest deviation from contact coplanarity to a pre-determined specification.

6. The method of claim 5, further comprising the step of sorting packaged semiconductor devices that have a highest deviation at or in excess of said pre-determined specification from packaged semiconductor devices that have a highest deviation less than said pre-determined specification.

7. The method of claim 5, wherein said step of measuring comprises measuring the relative positions of said contacts using a 3-point seating plane method.

8. The method of claim 5, wherein said contacts are leads extending in a gull-wing pattern from said packaged semiconductor device.

9. The method of claim 5, wherein said contacts are solder balls attached to a bottom side of said packaged semiconductor device.

* * * * *